(12) United States Patent
Shen et al.

(10) Patent No.: US 7,020,036 B2
(45) Date of Patent: Mar. 28, 2006

(54) MEMORY UNIT WITH SENSING CURRENT STABILIZATION

(75) Inventors: Chiun-Chi Shen, Hsin-Chu Hsien (TW); Chun-Hung Lu, Yun-Lin (TW); Chien-Hung Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/904,381

(22) Filed: Nov. 8, 2004

(65) Prior Publication Data

US 2006/0044902 A1    Mar. 2, 2006

Related U.S. Application Data

(60) Provisional application No. 60/522,177, filed on Aug. 26, 2004.

(51) Int. Cl.
  *G11C 7/02* (2006.01)

(52) U.S. Cl. ............................ 365/210; 365/207
(58) Field of Classification Search ................ 365/210, 365/207, 189.09
  See application file for complete search history.

(56) References Cited

U.S. PATENT DOCUMENTS 5,864,513 A * 1/1999 Pascucci .................. 365/210
2003/0156458 A1* 8/2003 Confalonieri ........ 365/185.21

* cited by examiner

*Primary Examiner*—A Phung
(74) *Attorney, Agent, or Firm*—Winston Hsu

(57) ABSTRACT

A memory unit with sensing current stabilization includes: a memory cell; a reference cell for providing a reference current; a current mirror coupled to the memory cell and the reference cell for generating a differential current according to the reference current and a cell current of the memory cell; and a sense amplifier coupled to the current mirror for generating an output voltage according to the differential current.

6 Claims, 2 Drawing Sheets

MEMORY UNIT WITH SENSING CURRENT STABILIZATION

CROSS REFERENCE TO RELATED APPLICATIONS

This application claims the benefit of U.S. Provisional Application No. 60/522,177, filed Aug. 26, 2004, entitled "SENSE AMPLIFIER WITH SENSING CURRENT STABILIZATION" and included herein by reference.

BACKGROUND OF INVENTION

1. Field of the Invention

The present invention provides a memory unit with sensing current stabilization, and more particularly, a memory unit with a current mirror for maintaining an input current of a sense amplifier.

2. Description of the Prior Art

A memory is a vital component in electronic products. The memory includes a memory cell array including memory units each for storing a bit of digital data and performing programming, erasing, and reading according to control signals transmitted from a word line, a bit line, and et al. A sense amplifier in a memory unit is usually provided for sensing digital data stored in a memory cell of the memory unit and generating an output signal corresponding to the digital data when the memory is reading the memory cell.

Please refer to FIG. 1, which illustrates a block diagram of a prior art memory unit 10 in a memory. The memory unit 10, including a memory cell 12 and a sense amplifier 14, stores a digital data. The sense amplifier 14 senses an output signal of the memory cell 12 through a bit line 16 and outputs a signal SAOUT accordingly. The output signal of the memory cell 12 is low for programming or high for erasing, for example. Considering high-speed operations, the current of the low-level output signal of the memory cell 12 is set to be greater than 40 µA, while the current of the high-level output signal is set to be smaller than 5 µA. Although the current of the low-level output signal of the memory cell 12 is over eight times the current of the high-level output signal, the difference between the currents is still small (<1 mA). As a result, the sense amplifier 14 may mistake in determining the output signal of the memory cell 12 in different process, voltage and temperature conditions, which may cause the current of the output signal of the memory cell 12 drifting unexpectedly.

SUMMARY OF INVENTION

It is therefore a primary objective of the claimed invention to provide a memory unit with sensing current stabilization.

According to the claimed invention, a memory unit with sensing current stabilization includes: a memory cell; a reference cell for providing a reference current; a current mirror coupled to the memory cell and the reference cell for generating a differential current according to the reference current and a cell current of the memory cell; and a sense amplifier coupled to the current mirror for generating an output voltage according to the differential current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
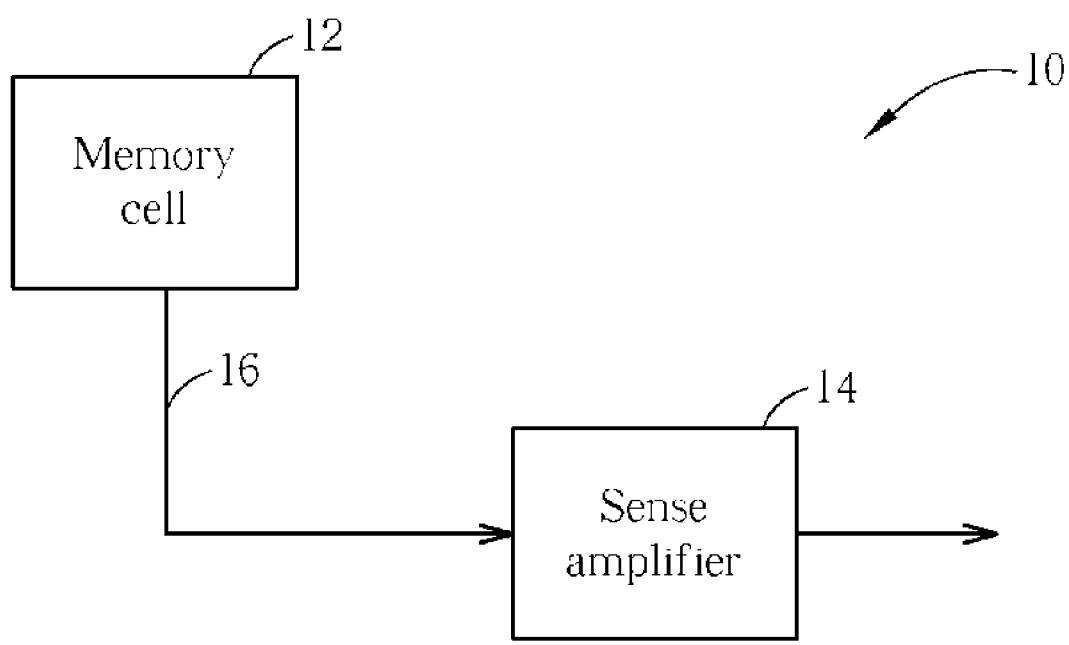
FIG. 1 illustrates a block diagram of a prior art memory unit in a memory.
Figure 2:
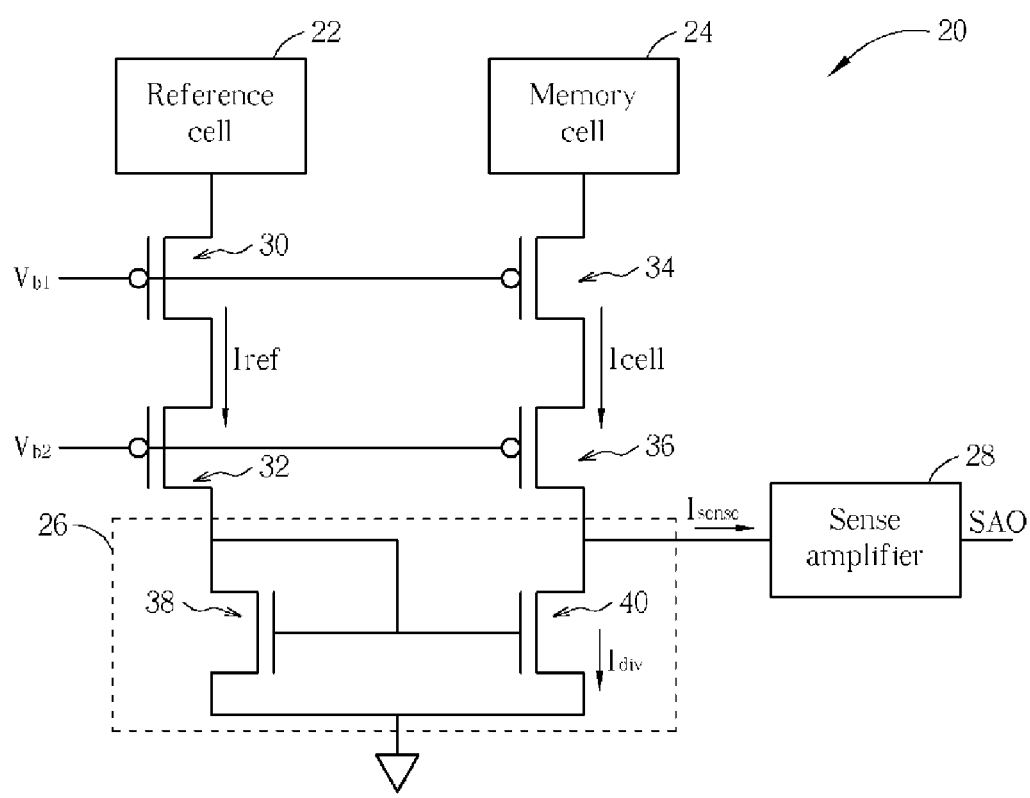
FIG. 2 illustrates a schematic diagram of a memory unit of a memory in accordance with the present invention.

Please refer to FIG. 2, which illustrates a schematic diagram of a memory unit 20 of a memory in accordance with the present invention. The memory unit 20 includes a reference cell 22, a memory cell 24, a current mirror 26, a sense amplifier 28, and transistors 30, 32, 34, and 36. The transistors 30&32, and 34&36 triggered by signals $V_{b1}$ and $V_{b2}$ are bias and switch circuits. The current mirror 26 includes transistors 38 and 40, where the drains of the transistor 38 and 40 are coupled to the drains of the transistor 32 and 36.

In FIG. 2, the reference cell 22 provides a reference current $I_{ref}$ through the transistors 30 and 32 to the transistor 38 of the current mirror 26, while the memory cell 24 provides a cell current $I_{cell}$ through the transistors 34 and 36 to the transistor 40 of the current mirror 26. As those skilled in the art recognize, the current mirror 26 provides same-direction and almost same-degree currents in the drains of the transistors 38 and 40. Therefore, a current $I_{div}$ in the drain of the transistor 40 almost equals the current $I_{ref}$, so an input current $I_{sense}$ of the sense amplifier 28 is the difference between the current $I_{cell}$ and the current $I_{div}$, or $I_{sense}=I_{cell}-I_{div}\approx I_{cell}-I_{ref}$. With the current $I_{ref}$ provided by the reference cell 22, the input current $I_{sense}$ of the sense amplifier 28 can resist current drifting of the memory cell 24.

For example, if the reference current $I_{ref}$ of the reference cell 22 is set to equal a low-level output current (5 µA) of the memory cell 24, the current $I_{div}$ also closes to the low-level current (5 µA). When the memory is reading a high-level digital data, such as logic 1, stored in the memory cell 24, the memory cell 24 outputs the low-level current (5 µA) $I_{cell}$. As mentioned above, the current $I_{sense}$ equals the differential current between the currents $I_{cell}$ and $I_{ref}$, so in this case, the current $I_{sense}$ is almost 0 ($I_{sense}=I_{cell}-I_{div}=5$ µA−5 µA=0), and the sense amplifier 28 outputs the corresponding output SAO.

In some situations, such as in different operating temperature, pressure, voltage, etc., the output current $I_{cell}$ of the memory cell 24 may drift in different ranges. However, in the present invention, both the memory cell 24 and the reference cell 22 suffer the same situation. That is, even if the current $I_{cell}$ drifts owing to the memory cell 24 operating in an unideal condition, the current $I_{ref}$ also drifts in the same range. Therefore, the current $I_{sense}$ maintains almost 0 if the output current $I_{cell}$ of the memory cell 24 is low.

On the other hand, if the memory cell 24 stores a low-level digital data, such as logic 0, when the memory is reading the low-level digital data, the memory cell 24 outputs the high-level current (40 µA) $I_{cell}$ to the transistor 40 of the current mirror 26, and the current $I_{sense}$ becomes 35 µA (40 µA−5 µA). As mentioned above, if the high-level current $I_{cell}$ drifts to 45 µA, the current $I_{ref}$ drifts with the same range to 10 µA. Therefore, the current $I_{sense}$ is still 35 µA.

In short, the present invention memory unit prevents the sense amplifier from mistaking in determining high or low of the currents $I_{cell}$. That is, even if the difference between the high-level and the low-level currents $I_{cell}$ is small, or if the current $I_{cell}$ drifts in different conditions, the present invention can maintain the input current $I_{sense}$ of the sense amplifier. In addition, other than setting the reference current $I_{ref}$ as the low-level current $I_{cell}$, the present invention can sets the reference current $I_{ref}$ equaling the high-level current $I_{cell}$ as long as the sense amplifier changes the determining standard. Besides, the current mirror of the present invention in FIG. 2 is just an embodiment. As those skilled in the art recognize, there are other kinds of current mirrors, which can provide same currents in inputs and outputs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory unit with sensing current stabilization comprising:
    a memory cell;
    a reference cell for providing a reference current;
    a current mirror coupled to the memory cell and the reference cell for generating a differential current according to the reference current and a cell current of the memory cell; and
    a sense amplifier coupled to the current mirror for generating an output voltage according to the differential current.

2. The memory unit of claim 1 wherein the sense amplifier is coupled to the memory cell.

3. The memory unit of claim 1 further comprising a bias circuit between the current mirror and the memory cell.

4. The memory unit of claim 1 further comprising a switch circuit between the current mirror and the reference cell.

5. The memory unit of claim 1 wherein a logic level of the reference current is high.

6. The memory unit of claim 1 wherein a logic level of the reference current is low.

* * * * *